(12) United States Patent
O'Brien et al.

(10) Patent No.: US 9,960,300 B2
(45) Date of Patent: May 1, 2018

(54) PHOTOVOLTAIC MODULE USING PVDF BASED FLEXIBLE GLAZING FILM

(75) Inventors: Gregory S. O'Brien, Downingtown, PA (US); Jiaxin Jason Ge, Lower Providence, PA (US)

(73) Assignee: Arkema Inc., Philadelphia, PA (US)

( * ) Notice: Subject to any disclaimer, the term of this patent is extended or adjusted under 35 U.S.C. 154(b) by 684 days.

(21) Appl. No.: 12/743,918

(22) PCT Filed: Nov. 18, 2008

(86) PCT No.: PCT/US2008/083850
§ 371 (c)(1),
(2), (4) Date: May 20, 2010

(87) PCT Pub. No.: WO2009/067422
PCT Pub. Date: May 28, 2009

(65) Prior Publication Data
US 2010/0258162 A1    Oct. 14, 2010

Related U.S. Application Data

(60) Provisional application No. 60/989,501, filed on Nov. 21, 2007.

(51) Int. Cl.
*H01L 31/048* (2014.01)

(52) U.S. Cl.
CPC ........ *H01L 31/048* (2013.01); *B32B 2327/12* (2013.01); *B32B 2367/00* (2013.01); *Y02E 10/50* (2013.01)

(58) Field of Classification Search
CPC ............... H01L 31/048; B32B 2327/12; B32B 2367/00; Y02E 10/50
USPC ................ 136/244, 245, 251, 252, 256, 259
See application file for complete search history.

(56) References Cited

U.S. PATENT DOCUMENTS

| | | | | |
|---|---|---|---|---|
| 3,967,032 A | * | 6/1976 | Plotz et al. | 428/292.1 |
| 4,860,509 A | * | 8/1989 | Laaly et al. | 52/173.3 |
| 4,868,036 A | * | 9/1989 | Robinet | 428/220 |
| 5,130,178 A | * | 7/1992 | Zerfass | D04H 3/011 156/167 |
| 5,262,486 A | * | 11/1993 | Telser et al. | 525/243 |
| 5,278,694 A | | 1/1994 | Wheatley et al. | |
| 5,578,141 A | * | 11/1996 | Mori et al. | 136/251 |
| 5,582,653 A | * | 12/1996 | Kataoka et al. | 136/251 |
| 5,679,176 A | | 10/1997 | Tsuzuki et al. | |
| 6,093,757 A | * | 7/2000 | Pern | 524/99 |
| 6,130,379 A | * | 10/2000 | Shiotsuka et al. | 136/251 |
| 6,335,479 B1 | * | 1/2002 | Yamada et al. | 136/251 |
| 6,441,299 B2 | | 8/2002 | Otani et al. | |
| 2001/0009160 A1 | * | 7/2001 | Otani et al. | 136/251 |
| 2002/0020440 A1 | | 2/2002 | Yoshimine et al. | |
| 2005/0187354 A1 | * | 8/2005 | Bonnet | C08L 27/16 525/276 |
| 2007/0106010 A1 | * | 5/2007 | Hedhli et al. | 524/544 |
| 2007/0166469 A1 | | 7/2007 | Snow et al. | |
| 2007/0206010 A1 | | 9/2007 | Morishita | |
| 2007/0221268 A1 | | 9/2007 | Hasch | |
| 2009/0275251 A1 | * | 11/2009 | Bonnet et al. | 442/133 |
| 2010/0000610 A1 | | 1/2010 | King et al. | |

FOREIGN PATENT DOCUMENTS

| | | | | |
|---|---|---|---|---|
| FR | 2896445 | * | 7/2007 | B32B 27/08 |
| JP | 10256580 | | 9/1998 | |
| JP | 2002-111018 | | 4/2002 | |

OTHER PUBLICATIONS

Mark Alger, "Polymer Science Dictionary, 2nd Edition", Chapman & Hall, New York (1997).*
Ebnesajjad et al , "Fluoropolymers Applications in Chemical Processing Industries—The Definitive User's Guide and Databook", William Andrew Publishing, 2005 p. 104.*
Durable Corrugated Sheets for Graphics, Sinage and Packagin, Oribs pp. 1-2 (no date given) obtained from http://www.corbiplastics.com/pdf/ORBIS_Corrugated_sheet_for_graphic_packaging_v2_031512.pdf.*
PVFD Resin—May 12, 2003, p. 1—ChenGuang Research Institute of Chemical Industry, obtained online from http://web.archive.org/web/20030512041800/http://www.chenguang-chemi.com/PVdF.htm.*
Poly(vinylidene fluoride pp. 1-2, obtained online from http://www.polymerprocessing.com/polymers/PVDF.html.*

* cited by examiner

*Primary Examiner* — Alexander Kollias
(74) *Attorney, Agent, or Firm* — Thomas Roland

(57) ABSTRACT

The invention relates to flexible photovoltaic (PV) modules, and in particular to those having a polyvinylidene fluoride (PVDF) glazing layer. The PVDF layer may be a monolayer or a multi-layer structure.

4 Claims, No Drawings

PHOTOVOLTAIC MODULE USING PVDF BASED FLEXIBLE GLAZING FILM

FIELD OF THE INVENTION

The invention relates to flexible photovoltaic (PV) modules, and in particular to those having a polyvinylidene fluoride (PVDF) glazing layer.

BACKGROUND OF THE INVENTION

Photovoltaic modules in field-use suffer from performance loss over time due to dirt build up on the primary surface. The problem is even more severe in areas receiving little rainfall—often the same areas where cloudless days help maximize the available solar energy.

While glass is often used as the transparent glazing on many rigid PV units, it suffers from both a weight issue and inflexibility issue, and therefore is not useful in flexible PV applications.

Polyvinylidene fluoride (PVDF) is known to be highly chemical resistant, relatively inert, and having a very low surface energy that little can stick to. The low surface energy means that PVDF materials readily can shed dirt and grime. The use of a PVDF film over a rigid thermoplastic support layer in a photovoltaic module is described in PCT patent application PCT/US07/74538.

WO2007085769 describes multi-layer PVDF films used for laminates of multi-layer film constructions where it is laminated to PET or PEN.

A current trend in photovoltaic module is for "flexible" photovoltaic modules, which can be transported in a roll, and where all the components in the module (back substrate, solar cell, encapsulant and front glazing) need to be flexible. Expensive fluoropolymers such as ethylyene tetrafluoro ethylene (ETFE) are being employed for this application. These polymers are have excellent low-temperature impact resistance. However—there is a need for lower cost alternatives that can meet the performance requirements of this demanding application.

The glazing for a flexible photovoltaic module must have extended durability under solar radiation (especially UV), high transmittance of solar energy, the ability to adhere to the encapsulants which today are primarily peroxide cross-linked EVA, good dirt shedding and dirt release performance, the ability to not support mold or bacterial growth, the ability to withstand impacts from hail, the ability to withstand high temperature curing temperatures used to form the module without deformation and discoloration. Further, the glazing is ideally very thin—to lower the weight and the cost of the PV module.

This invention claims a constructions of PV modules that use specific PVDF films, coatings or laminates, for the front glazing of photovoltaic modules. Modules can be flexible, or rigid. The proper PVDF films, coatings or laminates can surprisingly meet all the requirements.

While PVDF is known to have very good weathering, it is also generally known to have poor cold temperature impact performance, which presents a problem during a hail storm and other low temperature impact.

It has now been found that properly formulated PVDF film, coatings or laminates can provide all of the key performance properties needed for a flexible glazing, as noted above, as well as offering the potential to produce lower cost constructions. Laminates adhered to an ethylene vinyl acetate (EVA), are especially effective. It has been found that the final laminate can withstand cold temperature impact due to the flexibility of the Kynar layers combined with the toughness of the EVA and/or laminating film. Ultimately, this now offers a lower cost option to todays high cost monolayer films.

SUMMARY OF THE INVENTION

The invention relates to a flexible photovoltaic module, comprising
  a) a transparent glazing material comprising a polyvinylidene fluoride (PVDF) outer layer exposed to the environment;
  b) an interior layer comprising a material capable of converting solar radiation into electrical energy; and
  c) a backsheet,
wherein said photovoltaic module is flexible.

DETAILED DESCRIPTION OF THE INVENTION

The invention relates to a flexible photovoltaic module, having a transparent polyvinylidene fluoride (PVDF) outer layer exposed to the environment.

By "flexible" as used herein is meant the ability to be produced and delivered in a roll form for later application and use.

By "transparent" as used herein is meant that the total transmittance as measured by ASTM D1003 is greater than 85%.

A flexible photovoltaic module will consist, at a minimum, of an exterior transparent glazing to allow solar radiation into the collector while protecting the module from the environment, an middle layer for collecting solar energy which is generally encapsulated, and a back sheet to prevent moisture from entering the collector.

Transparent PVDF Layer

The transparent polyvinylidene fluoride (PVDF) glazing can consist of a monolayer of properly formulated PVDF polymer, or may be the exterior layer in a multi-layer composite. By PVDF polymer, as used herein, is meant a homopolymer, a copolymer, a terpolymer or a blend of a PVDF homopolymer or copolymer with one or more other polymers that are compatible with the PVDF (co)polymer. PVDF copolymers and terpolymers of the invention are those in which vinylidene fluoride units comprise greater than 60% percent of the total weight of all the monomer units in the polymer, and more preferably, comprise greater than 75 percent of the total weight of the units. Copolymers, terpolymers and higher polymers of vinylidene fluoride may be made by reacting vinylidene fluoride with one or more monomers from the group consisting of vinyl fluoride, trifluoroethene, tetrafluoroethene, one or more of partly or fully fluorinated alpha-olefins such as 3,3,3-trifluoro-1-propene, 1,2,3,3,3-pentafluoropropene, 3,3,3,4,4-pentafluoro-1-butene, and hexafluoropropene, the partly fluorinated olefin hexafluoroisobutylene, perfluorinated vinyl ethers, such as perfluoromethyl vinyl ether, perfluoroethyl vinyl ether, perfluoro-n-propyl vinyl ether, and perfluoro-2-propoxypropyl vinyl ether, fluorinated dioxoles, such as perfluoro(1,3-dioxole) and perfluoro(2,2-dimethyl-1,3-dioxole), allylic, partly fluorinated allylic, or fluorinated allylic monomers, such as 2-hydroxyethyl allyl ether or 3-allyloxypropanediol, and ethene or propene. Preferred copolymers or terpolymers are formed with vinyl fluoride, trifluoroethene, tetrafluoroethene (TFE), and hexafluoropropene (HFP) and chlorotrifluoroethylene (CTFE).

In climates that typically experience low temperatures (below 0° C.), the PVDF glazing must be formulated to resist brittleness of the material. This can be accomplished with PVDF copolymers, such as those containing 5-30 mole percent of HFP. However, these copolymers have lower melting temperatures which is a disadvantage, as the PV module is often laminated at a temperatures of 130° C. to 150° C.

Some solutions that provide good low-temperature impact strength, while maintaining a high melting temperature include, but are not limited to:
a) PVDF having long chain branching, as described in US 2007-0106010 (incorporated herein by reference). The long chain branched PVDF homopolymers and copolymers also provide high clarity.
b) A PVDF/Etheylene vinyl acetate (EVA) composite. This could be accomplished, for example, by laminating a thin film of a PVDF copolymer directly to EVA, or by solution casting or coating a thin layer of a fluoropolymer or an acrylic modifier fluoropolymer over EVA.
c) A blend of PVDF/polymethyl methacrylate (PMMA) copolymer, having <40 weight percent of PMMA. This blend could be impact modified.
d) PVDF, homopolymer of copolymer that are impact modified. A preferred embodiment would be a 5 to 50 percent, and more preferably a 7 to 25 weight percent loading of impact modifier particles. Preferably, the impact modifiers are acrylic core-shell impact modifiers. Useful impact modifiers would also include block copolymers, with a preferred embodiment being block copolymers made using a controlled radical polymerization. These block copolymers would have one block of a higher Tg composition, and the other block with a low Tg composition. In one embodiment, the block copolymer is an all-acrylic composition—with each block having more than 50% of (meth)acrylic monomer units. In one embodiment, the refractive indices of the impact modified and matrix material are matched—meaning they are within 0.03.
e) A film laminate, such as, but not limited to, a monolayer PVDF film coated or laminated onto a polyethylene terephthlate (PET) substrate. The PET could be surface-modified for increased adhesion.
f) Copolymer films of PVDF and HFP, including Kynar 3120-50 (Tm=162° C.), and Kynar 2800 (Tm=145° C.). Useful copolymers could also include, but are not limited to $VF_2$/TFE copolymers, and $VF_2$/TFE/HFP copolymers.
g) The PVDF film could be a multi-layer film. The outer layer being a PVDF copolymer, homopolymer or impact modified polymer, and the inner layer being one that increases the adhesion of the PVDF layer to the encapsulant such as a PVDF (meth)acrylic blend, or a functionalized PVDF. The inner layer may optionally contain a UV absorber. The UV absorber will be present at above 1 weight percent, based on the weight of the multi-layer PVDF film.

The PVDF layer can be surface-treated to increase adhesion. The PVDF layer may optionally contain additives, such as UV absorbers, UV stabilizers, plasticizers, fillers, coloring agents, pigments, antioxidants, antistatic agents, surfactants, refractive index matching additives, and dispersing aids at low levels. Any additives should be chosen and used at minimal levels, to avoid interference with the transmission of solar radiation through the glazing. Further, an SiOx or PVDC coating may be placed on the outside layer of the PVDF film to further enhance the barrier properties.

The choice of a co-polymers offers the extensibility and toughness, while maintaining a melting point over 140° C. and most preferably over 150° C. which is the temperature range for lamination and curing of the EVA based encapsulant.

The PVDF layer in the flexible PV has a thickness of from 5 to 150 microns, preferably 10 to 100, most preferably 15 to 50.

Interior Layer

The interior layer of the flexible photovoltaic module consists of a material that is capable of converting solar radiation into electrical current. The interior layer can be composed of materials known in the art for this purpose including, but not limited to amorphous silicon, copper indium selenide (CIS), copper-indium gallium selenide (CIGS), quantum dots, cadmium telluride (CdTe), amorphous silicon/microcrystalline silicon blend.

The solar radiation collectors are generally fragile, and so are encapsulated for protection. The encapsulant can be any encapsulant known in the art. In one embodiment the encapsulant is poly(ethylene vinyl acetate) with peroxides and stabilizers, or thermoplastic encapsulants based on alpha olefins ionomers, silicones, polyvinyl butyral, etc.

Back Sheet Layer

The primary function of the back sheet is to protect the solar collection material from water, UV radiation and oxygen.

The backsheet of the collector can be any material having the desired flexibility for use in the flexible photovoltaic module. Examples of useful back sheet materials include, but are not limited to metal, such as steel or aluminum, a polyvinyl fluoride (PVF) material, such as TEDLAR from DuPont (U.S. Pat. No. 6,646,196); an ionomer/nylon alloy (U.S. Pat. No. 6,660,930), polyethylene terephthalate (PET), polyethylene naphthalate (PEN), PVF/PET/PVF, laminate TPT, and PVDF (as described in U.S. application 60/944,188, incorporated herein by reference). These materials can be used for the backsheet alone or and in combination, and as a single or multi-layer construction.

In addition to the glazing, interior solar collecting layer and backsheet, the flexible photovoltaic module may contain other components, including but not limited to concentrating lenses, adhesives and tie layers, UV absorbers, etc.

EXAMPLES

Example 1

A 50 micron film of a PVDF copolymer of polyvinylidene fluoride and hexafluoro-propylene, with a melting point of Tm=155 to 160 C was surface treated using a corona treatment with a watt density (watts/ft2/min) of 4 and 8 by corona treatment to raise the surface energy level on the bonding side to more than 50 dynes/cm (52-58 dynes/cm). This film was then laminated onto a clean flat-glass plate using a 18 mil peroxide curable EVA sheet encapsulant formulation available from Specialize Technology Resources (STR)—Solar Division fast-cure EVA sheet with a product code of 15420 at 140 C for 15 minutes. The peel adhesion between the PVDF and cured EVA was measured in an Instron using a T-Peel configuration. The adhesion was measured at 20 to 25 pounds per linear inch. This type of adhesion is required for long term durability of an PV module.

Example 2

A 50 micron film of a PVDF/HPF copolymer with a melting point of 155 to 160° C. was corona surface treated as noted above to a surface energy of 56 dynes/cm. This was laminated to STR-EVA encapsulant 23 mil sheet of product code 15420 at 140 C for 15 minute to produce with an amorphous silicon PV cell on a stainless steel foil (SS). The final construction was as follows: PVDF film/EVA 15420/a-Si Cell on SS/EVA 15420/Backsheet of polyvinyl fluoride (PVF)/PET/PVF. Optionally the PVDF copolymer film could be coated with a layer of additional adhesive promoting material (having compatibility with both PVDF copolymer and EVA or compatibility with PVDF copolymer and reactive with the peroxide curing agents in EVA).

Example 3

A 50 micron monolayer film of a ductile high melting (Tm=160 to 167 C) point PVDF/HFP copolymer is corona surface treated to a surface energy of 56 dynes/cm (could be: corona, plasma, chemical with or without and additional adhesive/primer coating) on one side to enhance adhesion. This film is then laminated into a flexible PV cell where the encapsulant is a peroxide curable EVA from STR coded 15420 and the solar collector is constructed of amorphous silicon on a stainless steel back layer.

Example 4

A multi-layer film of PVDF/PET (could be a PVDF/PET/PVDF) is formed using a cross-linking PVDF (terpolymers of PVDF/HFP/TFE coating with a permanent UV absorber coated onto an oriented heat stabilized PET that is primed to enhance adhesion. A solvent coating formulation was prepared using the formulation shown in Table 1 containing a PVDF copolymer (VF2/TFE/HFP) of low MW with a melt point of about 90° C., a hydroxy functional acrylic and a melamine cross-linker. This formulation was mixed by shaking for 30 minutes the contents with 125 grams of 4 mm glass beads on a paint shaker. This coating was coated onto a 5 mil PET available from SKC Films known at SH-22 (this is primed chemically on both sides to improve adhesion) using a 5-mil blade. It was allowed to flash in air for 5 minutes and then oven cured for 3 minutes at 350° F. in a forced air oven. The dry coating thickness was approximately 1 mil. The coated film was immersed into water at 85° C. for 72 hours, dried and cross-hatch adhesion was tested using the general procedure defined in ASTM D3359. The adhesion is reported as a percent retained after the tape has been applied and removed. A value of 100% means that all of the squares are still adhered to the substrate. A value of 50% means that 50% of the squares are retained on the substrate. In this example the sample adhesion was noted at 100%—which shows excellent adhesion. Nano zinc oxide is used as permanent UV to protect the PET.

TABLE 1

| Solvent Coating Formulation for polymer coating | Amount (g) |
|---|---|
| PVDF VDF/HFP/TFE terepolymer | 18.2 |
| PARALOID AU 1164 functional acrylic, Rohm and Haas | 8.8 |

TABLE 1-continued

| Solvent Coating Formulation for polymer coating | Amount (g) |
|---|---|
| t-butyl Acetate | 55.9 |
| NMP | 9.3 |
| CYMEL 300 (crosslinker), Cytec | 2.2 |
| NACURE 2500 (catalyst), King Industries Inc | 0.6 |
| UV absorber - NANOBYK 3821 from BYK Chemie | 5.0 |
| Total | 100.0 |

The opposite side of the PET from the PVDF coating is then corona treated to further enhance adhesion. This PVDF/PET laminate is then laminated with STR EVA encapsulant coded 15420 and an amorphous Silicon PV cell that is deposited on a stainless steel backing. The solar module composite structure would be (PVDF/PET structure)/EVA/a-Si Cell/EVA/Backsheet.

Example 5

A dispersion coating was formulated with PVDF homopolymer, powder, a functional acrylic and a cross-linker. The formulation of Table 2 was mixed for 30 minutes with 125 g of 4 mm glass beads in a paint shaker similar to that in Example 1. The coating was coated onto 5 mil PET film available from SKC(SH 22) that is primed on both sides to improve adhesion as one example. It was allowed to flash at room temperature for 5 minutes followed by oven curing for 3 minutes at 350° F. The film laminate was submerged in 85° C. water for 72 hours, and cross-hatch adhesion was tested as in Example 4 with 90% of the squares being retained on the substrate. This shows excellent adhesion.

TABLE 2

| Solvent Dispersion Example #2 | Amount (g) |
|---|---|
| PVDF homopolymer powder | 20.5 |
| PARALOID AU 1033 Acrylic (50% solids), Rohm and Haas | 17.6 |
| Isophorone | 41.8 |
| CYMEL 300 | 2.2 |
| NACURE 2500 | 0.6 |
| UV Absorber - NANOBYK 3821 | 6.0 |
| Total | 88.7 |

The opposite side of the PET from the PVDF coating can be further corona treated to further enhance adhesion. This PVDF/PET laminate is then laminated with STR EVA encapsulant coded 15420 and an amorphous Silicon PV cell that is deposited on a stainless steel backing. The Solar module composite structure would be (PVDF/PET structure)/EVA/a-Si Cell on SS/EVA/Backsheet.

Example 6

A dispersion coating formulation was prepared using the formulation shown in Table 3. The formulation of Table 3 was mixed for 30 minutes with 125 g of 4 mm glass beads in a paint shaker similar to that in Example 1. The coating was coated onto 5 mil PET film available from SKC (SH 22) that is primed on both sides to improve adhesion (one example of a PET film). It was allowed to flash at room temperature for 5 minutes followed by oven curing for 3 minutes at 350° F. The film laminate was submerged in 85° C. water for 72 hours, and cross-hatch adhesion was tested as in Example 4 with 100% of the squares being retained on the substrate. This shows excellent adhesion.

TABLE 3

| Dispersion Coating | Amount (g) |
| --- | --- |
| PVDF homopolymer powder | 20.5 |
| PARALOID B44 Acrylic (from Rohm and Haas) | 8.8 |
| Isophorone | 50.1 |
| UV Absorber - NANOBYK3821 | 6.0 |
| Total | 85.4 |

The opposite side of the PET from the PVDF coating can be further corona treated to further enhance adhesion. This PVDF/PET laminate is then laminated with STR EVA encapsulant coded 15420 and an amorphous silicon PV cell that is deposited on a stainless steel backing. The Solar module composite structure would be (PVDF/PET structure)/EVA/a-Si Cell/EVA/Backsheet.

Example 7

The films from Examples 1 through 6 were coated with SiOx by appropriate treatments on the side that will be bonded to the EVA encapsulant. These are then bonded to the PV module as noted above using STR-15420 EVA encapsulant sheet.

Example 8

The film from Example 3 having a solvent coating of a cross-linkable formulation of PVDF/acrylic or acrylic is coated onto the surface treated side of the film to a coating thickness of 25 micron as a dry thickness. The coating formulations are noted in Table 4. This formulation was mixed by shaking for 30 minutes the contents with 125 grams of 4 mm glass beads on a paint shaker. This coating was coated onto the PVDF film using a 5-mil blade. It was allowed to flash in air for 5 minutes and then oven cured for 5 minutes at 250° F. in a forced air oven. The dry coating thickness is approximately 1 mil.

TABLE 4

|  | Coating 1 | Coating 2 |
| --- | --- | --- |
| PVDF of Example 4 | 20.5 | — |
| PARALOID B72 50% | — | 40.0 |
| PARALOID AU1033 | 17.6 | 40.0 |
| t-butyl acetate | 71 | — |
| NMP | 4 | — |
| CYMEL 301 | 2.2 | 5.0 |
| NACURE 2500 | 0.6 | — |
| NANO BYK 3821 | 6.0 | 6.0 |
| TOTAL | 121.9 | 91.0 |

The coated side of the PVDF film is then laminated into the solar module as before using the STR EVA encapsulant coded 15420 for 15 minutes at 140 C.

Example 9

Two PVDF based films are produced by dispersion casting them onto PET oriented and heat set films as a carrier layer. The two formulations are noted in Table 5 below for these films. The formulations were mixed for 30 minutes with 125 g of 4 mm glass beads in a paint shaker similar to that in Example 1. They are coated onto a 5 mil PET carrier film using a 5 mil bar to produce a 1 mil dry film. It was allowed to flash at room temperature for 5 minutes followed by oven curing for 3 minutes at 350° F. The PVDF coating side is then corona treated to a surface energy >50 dynes/cm.

TABLE 5

| Dispersion Coating | Amount (g) Coating #1 | Amount (g) Coating #2 |
| --- | --- | --- |
| PVDF copolymer powder (VDF/HFP, MP 160-167° C.) | 20.5 | |
| PVDF homopolymer powder | | 20.5 |
| PARALOID B44 Acrylic | 5.2 | 5.2 |
| Isophorone | 50.1 | 50.1 |
| UV Absorber - Nano BYK3821 | 6.0 | 6.0 |
| Total | 85.4 | 85.4 |

The PVDF side of the PVDF/PET film structure is then laminated to a solar module using STR EVA code 15420 at 140 C for 15 minutes. After curing the PET film is removed leaving the solar module with a PVDF film layer on the top surface.

Example 10

A melt blend is produced in a twin-screw compounder of a PVDF homopolymer with a PMMA high Tg acid copolymer with methacrylic acid at a ratio of 70% by weight PVDF and 30% PMMA copolymer. This formulation is melt extruded into a 2 mil film, which is then corona treated to a surface energy greater then 50 dynes/cm. The film is then laminated as noted in Example 3.

What is claimed is:
1. A photovoltaic module, comprising, in order from front to back:
   a) a transparent polyvinylidene fluoride (PVDF) glazing exterior layer exposed to solar radiation, consisting of a polyvinylidene fluoride/hexafluoropropene copolymer comprising 5-40 mole percent of hexafluoropropene and at least 60 mole percent of vinylidene fluoride monomer units, and having a melting point of from 145° C. to 167° C., and optional additives wherein said transparent polyvinylidene fluoride glazing exterior layer has a thickness of from 5 to 50 microns;
   b) an interior layer comprising a material capable of converting solar radiation into electrical energy and encapsulated in an encapsulant selected from the group consisting of ethylene vinyl acetate, thermoplastic encapsulants based on alpha olefin ionomers, silicones and polyvinyl butyral; and
   c) a back sheet comprising a layer consisting of a material selected from the group consisting of polyvinyl fluoride, an ionomer/nylon alloy, polyethylene terephthalate polyethylene naphthalate, and polyvinylidene fluoride,
   wherein said photovoltaic module is flexible, and wherein transparent polyvinylidene fluoride glazing exterior layer is directly attached to said encapsulant.
2. The photovoltaic module of claim 1, wherein said polyvinylidene fluoride/hexafluoropropene copolymer comprises polyvinylidene fluoride, having long chain branching.
3. The photovoltaic module of claim 1, wherein said polyvinylidene fluoride/hexafluoropropene copolymer has a melting point of greater than 150° C. to 167° C.
4. The photovoltaic module of claim 1, wherein said transparent polyvinylidene fluoride glazing exterior layer been treated to promote good adhesion by a corona, plasma, chemical or flame treatment, to more than 40 dynes/cm.

* * * * *